United States Patent
Jeong et al.

(10) Patent No.: US 10,910,589 B2
(45) Date of Patent: Feb. 2, 2021

(54) FLEXIBLE DISPLAY APPARATUS HAVING POLARIZATION STRUCTURE EXTENDING UP TO BENDING PART

(71) Applicant: LG Display Co., Ltd., Seoul (KR)

(72) Inventors: Hae-Yong Jeong, Paju-si (KR); Dong-Soo Shin, Gwangju (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/688,293

(22) Filed: Nov. 19, 2019

(65) Prior Publication Data

US 2020/0185641 A1 Jun. 11, 2020

(30) Foreign Application Priority Data

Dec. 7, 2018 (KR) .......................... 10-2018-0156655

(51) Int. Cl.
*H01L 51/52* (2006.01)
(52) U.S. Cl.
CPC .. *H01L 51/5237* (2013.01); *H01L 2251/5338* (2013.01)
(58) Field of Classification Search
CPC ................. H01L 51/52; H01L 51/5237; H01L 2251/5338; H01L 29/08; H01L 27/32; H01L 51/00

USPC .......................................................... 257/40
See application file for complete search history.

(56) References Cited

U.S. PATENT DOCUMENTS

| | | | | |
|---|---|---|---|---|
| 9,276,055 | B1* | 3/2016 | Son | ..................... H01L 51/5253 |
| 2015/0253487 | A1* | 9/2015 | Nichol | ................... G02B 6/006 |
| | | | | 362/610 |
| 2018/0351117 | A1* | 12/2018 | Kim | ................... H01L 51/5253 |
| 2019/0212788 | A1* | 7/2019 | Kwak | .................... G06F 1/1686 |
| 2019/0377445 | A1* | 12/2019 | Jeong | ................... G06F 3/0412 |
| 2020/0174526 | A1* | 6/2020 | Jeong | ................... G06F 1/1652 |

* cited by examiner

*Primary Examiner* — Alexander O Williams
(74) *Attorney, Agent, or Firm* — Birch, Stewart, Kolasch & Birch, LLP

(57) ABSTRACT

A flexible display apparatus includes a flexible substrate including an active area and an inactive area, the inactive area comprising a first area disposed adjacent to the active area, a second area where a circuit board is disposed, and a bending area disposed between the first area and the second area, a first support layer disposed below the active area and the first area, and a second support layer disposed below the second area, an encapsulation layer disposed over the active area and the first area, and a polarization film disposed over the encapsulation layer. The polarization film extends up to at least a portion of the second area via the bending area, thereby reducing defects generated during bezel bending. Accordingly, a more stable display apparatus can be provided.

19 Claims, 12 Drawing Sheets

FLEXIBLE DISPLAY APPARATUS HAVING POLARIZATION STRUCTURE EXTENDING UP TO BENDING PART

CROSS-REFERENCE TO RELATED APPLICATION

This application claims the benefit of Korean Patent Application No. 10-2018-0156655 filed on Dec. 7, 2018 in the Korean Intellectual Patent Office, the disclosure of which is hereby incorporated by reference in its entirety as if fully set forth herein.

BACKGROUND OF THE INVENTION

Field of the Invention

The present disclosure relates to a display apparatus, and more particularly to a display apparatus including a flexible display panel.

Discussion of the Related Art

In recent years, with the advent of the information age, the field of displays to visually express electrical information signals has rapidly developed. As such, a variety of display apparatuses having superior performance such as slimness, lightness and low power consumption have rapidly been developed.

Representative examples of such display apparatuses can include liquid crystal display (LCD) apparatuses, organic light emitting display (OLED) apparatuses, quantum dot display apparatuses, and the like.

Such a display apparatus can include a display panel, and a plurality of components for providing various functions. For example, one or more display driving circuits for controlling the display panel can be included in a display assembly. Examples of such display driving circuits can include gate drivers, light emission (source) drivers, electric power (VDD) routing circuits, electrostatic discharge (ESD) circuits, multiplexing (MUX) circuits, data signal lines, cathode contacts and other functional elements. A plurality of peripheral circuits for providing various kinds of additional functions, for example, a touch sensing function and a fingerprint identification function can also be included in the display assembly. Certain components can be disposed on the display panel. Certain components can be disposed in peripheral areas around a display area, which are often referred to as a "non-display area" and/or an "inactive area" or a "non-active area" in the present disclosure.

Important factors in display design of modern display apparatuses are size and weight. Sometimes, it can be most important to increase the ratio of the size of an active area to the size of an inactive area, which is referred to as a "screen-to-bezel ratio". However, when a part of the above-mentioned components is disposed within the display assembly, a large inactive area, which can occupy a considerable portion of the display panel, can be needed. Such a large inactive area can cause the display panel to have a large size. In this case, it can be difficult to incorporate the display panel in a housing of the display apparatus. Furthermore, the large inactive area can require great masking (for example, a bezel enclosure or a covering material) in order to cover a considerable portion of the display panel and, as such, the display apparatus can have poor aesthetics.

Certain components can be disposed on a separate flexible printed circuit board (FPC) and, as such, can be disposed at a backplane of the display panel. In spite of such a configuration, however, components essentially required for panel driving such as interfaces for connecting lines between the FPC and the active area and a driver IC are still disposed in the inactive area and, as such, reduction of bezel size is still limited.

SUMMARY OF THE INVENTION

Accordingly, the present invention is directed to a flexible display apparatus that substantially obviates one or more problems due to limitations and disadvantages of the related art.

The inventors of the present disclosure recognized that various highly-advanced technologies associated with line position and line width, signal transfer method, etc. are required for realization of a narrow bezel exhibiting a reduced inactive area ratio. Therefore, the inventors of the present disclosure conducted research into various designs using flexibility characteristics of a display apparatus, to which a flexible substrate is applied. As a result, the inventors of the present disclosure invented a flexible display apparatus having a new structure capable of minimizing a non-display area other than an active area to display an image, for example, an inactive area.

For example, it can be desirable to increase the ratio of an active area by bending a portion of a display panel in order to manufacture a display apparatus having a smaller and lighter structure through reduction in the ratio of an inactive area. This can be achieved by disposing a part of the inactive area behind the active area of the display panel such that the inactive area, which should be hidden by a masking or a device housing disposed thereover, is reduced or eliminated.

An object of the present invention is to provide a flexible display apparatus capable of minimizing the size of an inactive area to be visually hidden through bending of a flexible substrate thereof, thereby achieving realization of a narrow-bezel or bezel-free display apparatus while achieving realization of an advanced design, and flexible display using the flexible display apparatus.

Additional advantages, objects, and features of the invention will be set forth in part in the description which follows and in part will become apparent to those having ordinary skill in the art upon examination of the following or can be learned from practice of the invention. The objectives and other advantages of the invention can be realized and attained by the structure particularly pointed out in the written description and claims hereof as well as the appended drawings.

To achieve these objects and other advantages and in accordance with the purpose of the invention, as embodied and broadly described herein, a flexible display apparatus includes a flexible substrate including an active area and an inactive area, the inactive area including a first area disposed adjacent to the active area, a second area where a circuit board is disposed, and a bending area disposed between the first area and the second area, a first support layer disposed beneath the active area and the first area, and a second support layer disposed beneath the second area, an encapsulation layer disposed over the active area and the first area, and a polarization film disposed over the encapsulation layer while extending up to at least a portion of the second area via the bending area.

In another embodiment of the present disclosure, a flexible display apparatus includes a substrate including a display area and a non-display area, light emitting display elements disposed in the display area, and an encapsulation layer disposed over at least a portion of the non-display area while covering the light emitting display elements, a component formation part, a notch line and a bending part disposed in a portion of the non-display area, a support layer disposed beneath the display area, and a polarization structure disposed over the encapsulation layer, the polarization structure extending up to the bending part while covering the component formation part and the notch line.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and along with the description serve to explain the principle of the invention. In the drawings.

DETAILED DESCRIPTION OF THE EMBODIMENTS

Figure 1:
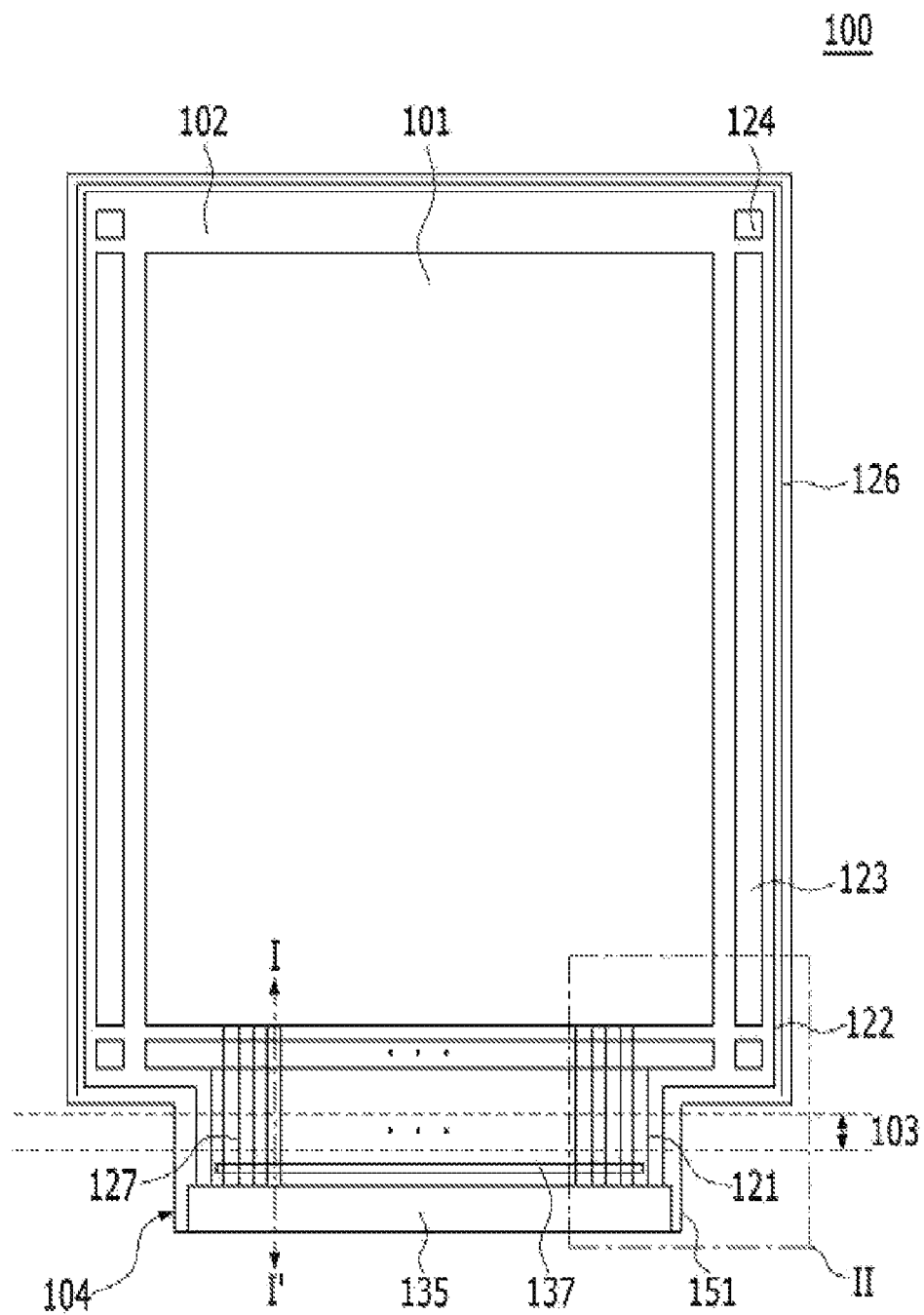
FIG. 1 is a view illustrating a layout of a display panel according to an embodiment of the present disclosure.

Reference will now be made in detail to embodiments, examples of which are illustrated in the accompanying drawings. However, the present disclosure can be embodied in many different forms and should not be construed as limited to the embodiments set forth herein. Rather, these embodiments are provided so that this disclosure will be thorough and complete, and will fully convey the scope of the disclosure to those skilled in the art. The present disclosure is defined only by the categories of the claims.

The shape, size, ratio, angle, number and the like shown in the drawings to illustrate the embodiments of the present invention are only for illustration and are not limited to the contents shown in the drawings. Wherever possible, the same reference numbers will be used throughout the drawings to refer to the same or like parts. In the following description, detailed descriptions of technologies or configurations related to the present invention can be omitted so as not to unnecessarily obscure the subject matter of the present invention. When terms such as "including", "having" and "comprising" are used throughout the specification, an additional component can be present, unless "only" is used. A component described in a singular form encompasses components in a plural form unless particularly stated otherwise.

It should be interpreted that the components included in the embodiment of the present invention include an error range, although there is no additional particular description thereof.

In describing a variety of embodiments of the present invention, when terms for positional relationships such as "on", "above", "under" and "next to" are used, at least one intervening element can be present between two elements unless "right" or "direct" is used.

In describing a variety of embodiments of the present invention, when a temporal relationship is described, for example, when terms for temporal relationship of events such as "after", "subsequently", "next", and "before" are used, there can also be the case in which the events are not continuous, unless "immediately" or "directly" is used.

In the meantime, although terms including an ordinal number, such as first or second, can be used to describe a variety of constituent elements, the constituent elements are not limited to the terms, and the terms are used only for the purpose of discriminating one constituent element from other constituent elements. For example, without departing from the scope of the present disclosure, a first constituent element can be named a second constituent element.

It will be understood that, although the terms first, second, A, B, (a), (b), etc. can be used herein to describe various elements of the present invention, these terms are only used to distinguish one element from another element and necessity, order, or sequence of corresponding elements are not limited by these terms. It will be understood that when one element is referred to as being "connected to", "coupled to", or "accessed by" another element, one element can be "connected to", "coupled to", or "accessed by" another element via a further element although one element can be directly connected to or directly accessed by another element.

In the present disclosure, "display apparatus" can include, in a narrow sense, display apparatuses such as a liquid crystal module (LCM) including a display panel and a driver for driving the display panel, an organic light emitting display (OLED) module, and a quantum dot (QD) module. In addition, the display apparatus can also include equipment displays including complete products or final products of LCM, OLED, and QD modules, for example, a notebook computer, a television, a computer monitor, an automotive display, or other displays for vehicles, and set electronic devices or set devices (set apparatuses) such as mobile electronic devices, for example, a smart phone and a tablet.

Accordingly, the display apparatus in the present disclosure can include application products or set apparatuses, as final products for consumers, including LCM, OLED, and QD modules as well as display apparatuses such as LCM, OLED, and QD modules.

If necessary, LCM, OLED, and QD modules, which include a display panel, a driver, etc., can be expressed, in a narrow sense, as display apparatuses, and electronic devices of final products including LCM, OLED, and QD modules can be expressed as set apparatuses. For example, such a display apparatus in a narrow sense can include a display panel constituted by an LCM, OLED, or QD module, and a source printed circuit board (source PCB) as a controller for driving the display panel. Meanwhile, such a set apparatus can include a set PCB as a set controller, which is connected to a source PCB, so as to control the entirety of the set apparatus.

As a display panel used for embodiments of the present disclosure, all types of display panels, for example, a liquid crystal display panel, an organic light emitting diode (OLED) display panel, a quantum dot display panel, an electroluminescent display panel, etc. can be used. Of course, the display panel is not limited to a particular display panel including a flexible substrate for an OLED display panel and a backplane support structure disposed beneath the display panel, thereby being capable of achieving bezel bending. The display panel used in a display apparatus according to an embodiment of the present disclosure is not limited in shape and size.

In more detail, when the display panel is an OLED display panel, the display panel can include a plurality of gate lines, a plurality of data lines, and a plurality of pixels provided in respective intersections between the gate lines and the data lines. In addition, the display panel can further include an array including thin film transistors as devices for selectively applying a voltage to the pixels, an OLED layer disposed on the array, and an encapsulation substrate or an encapsulation layer disposed on the array, to cover the OLED layer. The encapsulation layer protects the thin film transistors and the OLED layer from external impact. Layers formed on the array can include an inorganic light emitting layer, for example, a nano-scale material layer or a quantum dot layer, and the like.

There can be problems to be solved upon providing a flexible display panel.

Various components should be disposed immediately on a flexible substrate, together with display pixels. When a thin substrate is used for flexibility of the flexible substrate, the components can be weakened due to various mechanical stresses possibly generated during manufacture of the product and/or use of the product after completion of manufacture thereof. In particular, mechanical stress caused by bending of the flexible display panel can adversely affect reliability of the product or can further cause failure of completed components. For example, components such as a high-level voltage (VDD) line, a low-level voltage (VSS) line, and data signal lines formed in a bending area after extending from an inactive area can be subjected to both tension stress and shrinkage stress generated in the bending area during a bending process for bending the flexible substrate, a process of attaching a flexible printed circuit board (FPCB) or a data driver to the flexible substrate after completion of the bending process, or a process of coupling the manufactured display panel to a module of the display apparatus after completion of attachment. As a result, the VDD line, the VSS line or the data signal lines can be short-circuited or can have cracks. In the following description, the area where the flexible substrate is bent will be defined as a bending area or a bending portion.

In order to protect components from various stresses possibly generated as described above, a protective film having an organic property can be formed over the bending area. In a representative example, an organic film called a "microcoating layer (MCL)," can be disposed over the components in the bending area in order to avoid penetration of moisture into the components from the outside. The organic film can also function to allow various lines present in the bending area to be positioned near a neutral plane during a bending process and, as such, tension stress and shrinkage stress possibly applied to the lines can be reduced. If there is no microcoating layer, the components in the bending area can be exposed to the outside. As a result, the components can be exposed to physical impact, moisture and oxygen and, as such, can be chemically deformed. Furthermore, tension stress, which causes an increase in surface area at a top side, as compared to other sides, can be strongly applied to various components disposed at the uppermost side. Short circuit or partial cracking caused by the tension stress can function as a critical defect and, as such, can cause poor driving of the display panel. It can be possible to provide a structure having reduced defects by disposing a microcoating layer to protect various lines in the bending area, thereby absorbing physical/chemical impact possibly applied to the lines, enabling the lines to be disposed near a neutral plane in the overall laminated structure including the substrate and the microcoating layer in accordance with disposition of the microcoating layer, and absorbing tension stress and shrinkage stress by the microcoating layer in accordance with an organic property of the microcoating layer.

However, when the microcoating layer is applied in order to protect the lines disposed in the bending area, there can be a drawback in that the microcoating layer has poor resistance to external impact due to properties thereof as an organic film. For example, when the bending area is struck by an external structure having high hardness or comes into contact with a sharp portion of a module of the display apparatus such as a corner during a process of assembling the module due to carelessness of the operator performing the process, the bending area can be locally deformed and, as such, can be recessed in an inward radial direction of the bending area. Otherwise, the microcoating layer can be stripped or can become loose and, as such, the lines in the bending area can be exposed. Such exposure in the bending area causes penetration of moisture from the outside or short circuit of the lines and, as such, can directly adversely affect display quality.

In association with realization of a narrow-bezel or bezel-free display apparatus as described above, therefore, it can be important to develop a flexible structure capable of maintaining a bending structure and withstanding external force possibly applied to a bending area without being inconsistent with thinness and lightness as a tendency of currently developed display apparatuses. To this end, the inventors of the present disclosure invented a flexible display apparatus having a new structure enabling components in a bending area to withstand stresses generated during bending and external impact. This will be described hereinafter.

In the present disclosure, FIG. 1 illustrates an OLED display panel 100 which can be embodied in display apparatuses. All elements and components of the OLED display panel 100 are operationally coupled and configured.

Figure 2:
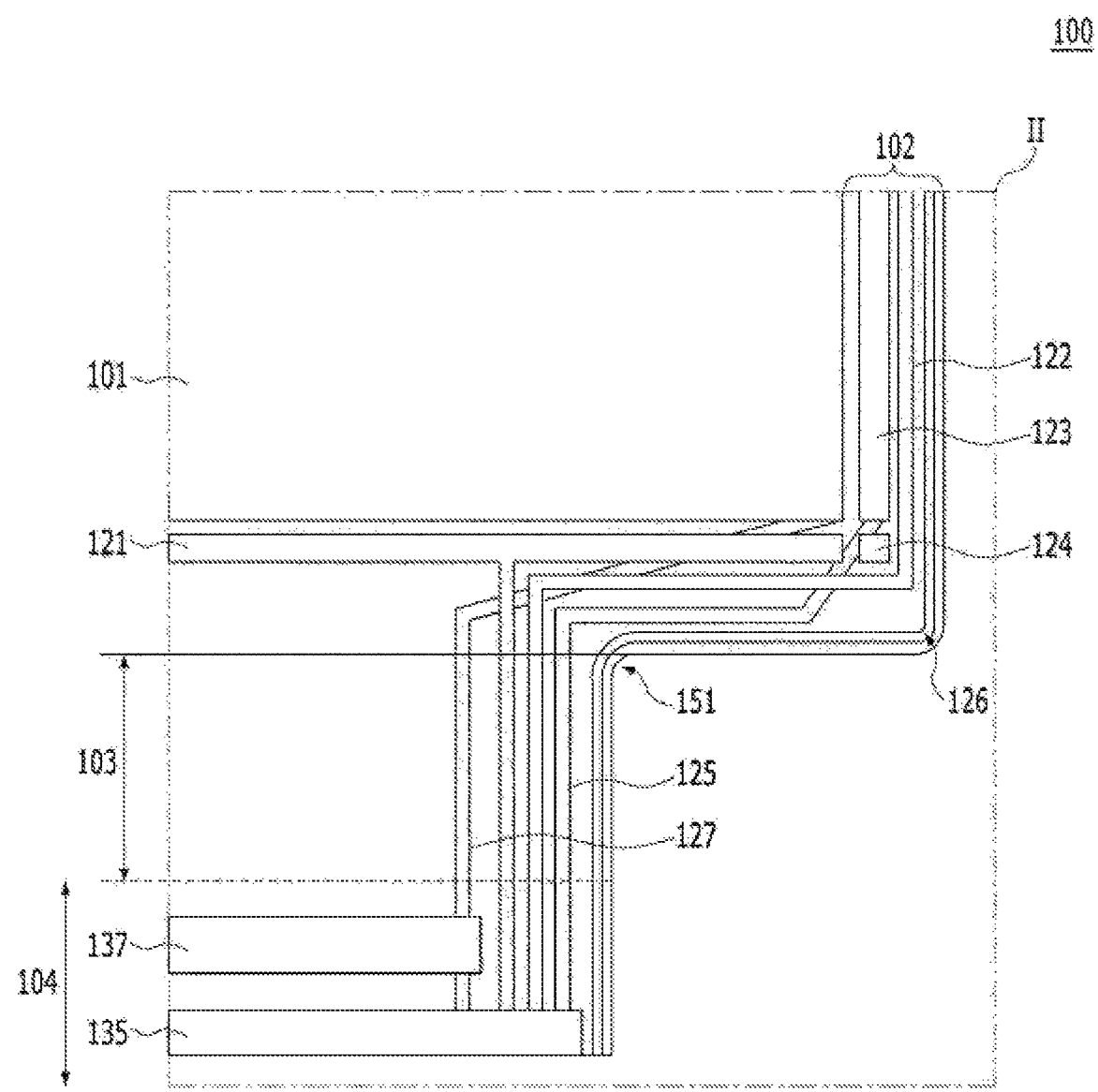
FIG. 2 is an enlarged view corresponding to an area II in FIG. 1.
Figure 3:
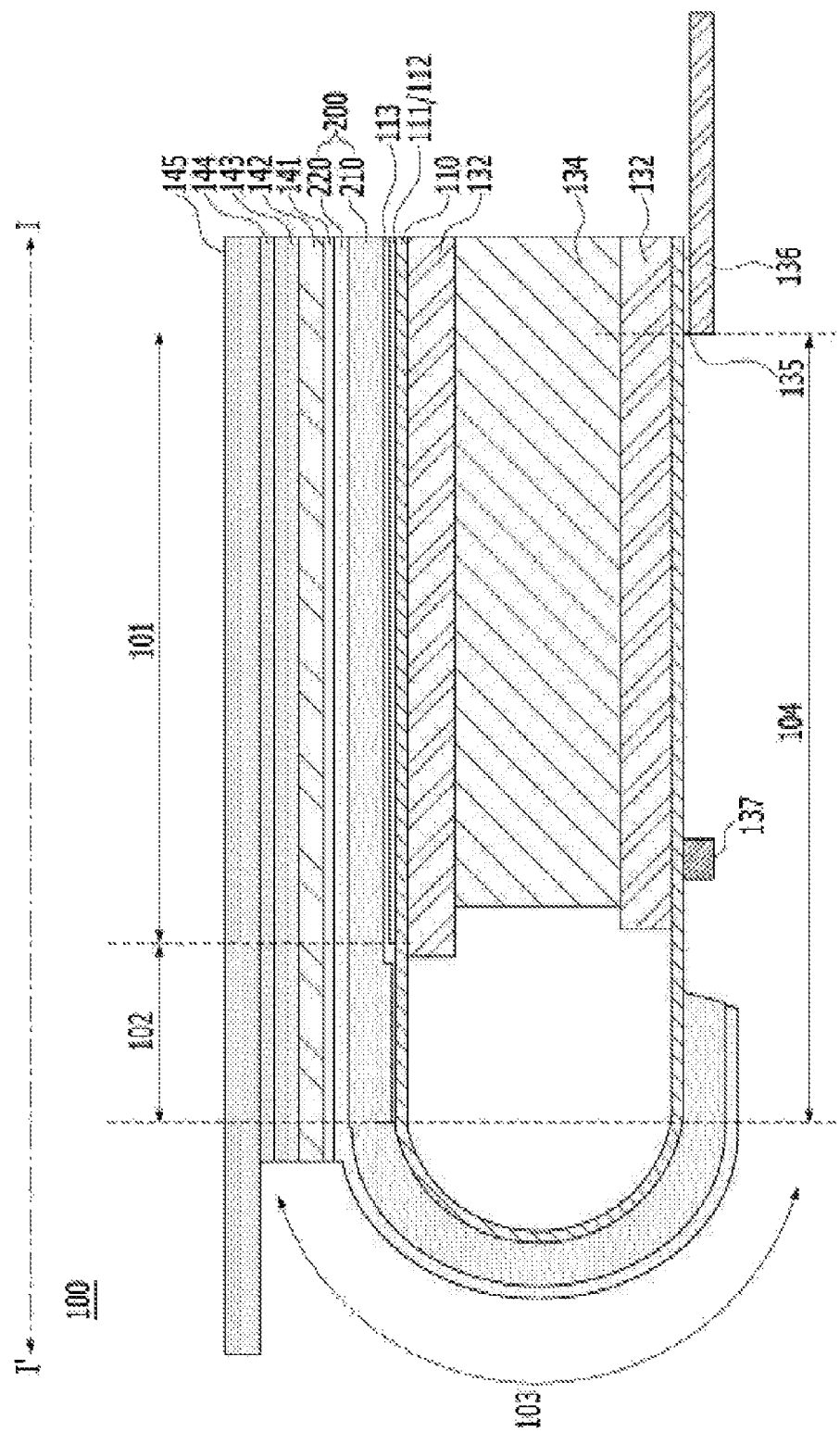
FIG. 3 is a cross-sectional view taken along line I-I' of FIG. 1.
Figure 4:
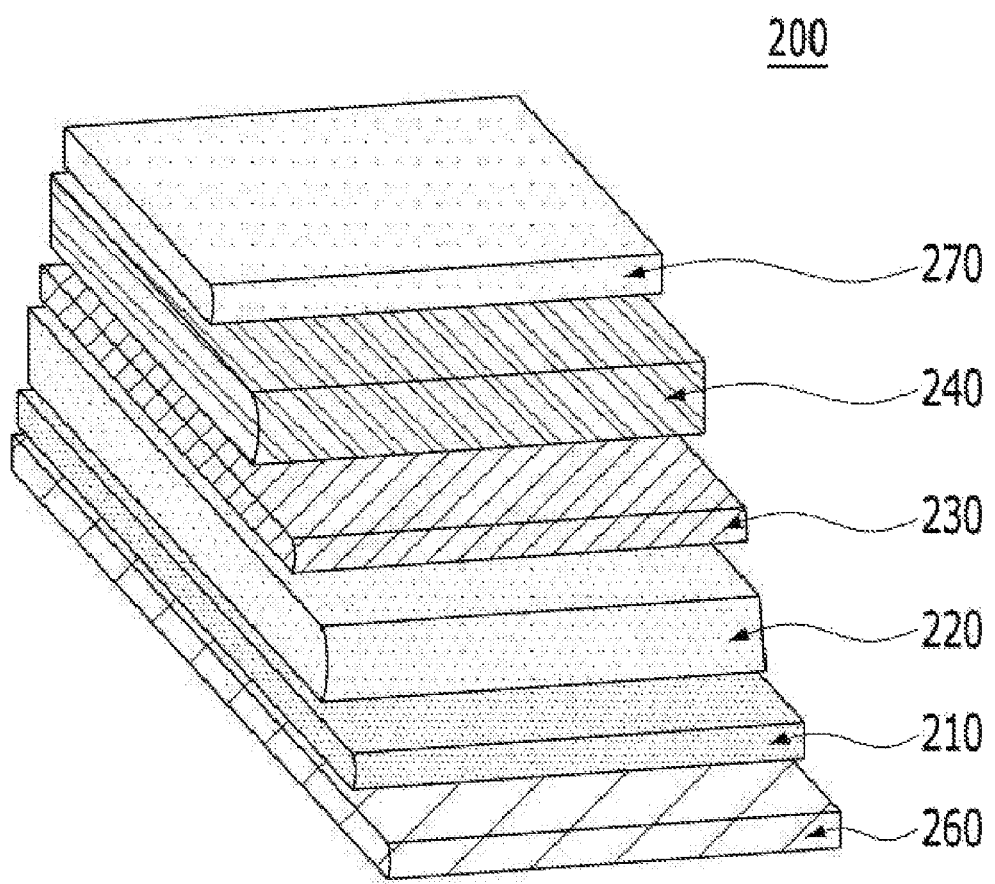
FIG. 4 is a view illustrating a polarization film according to an embodiment of the present disclosure.
Figure 5:
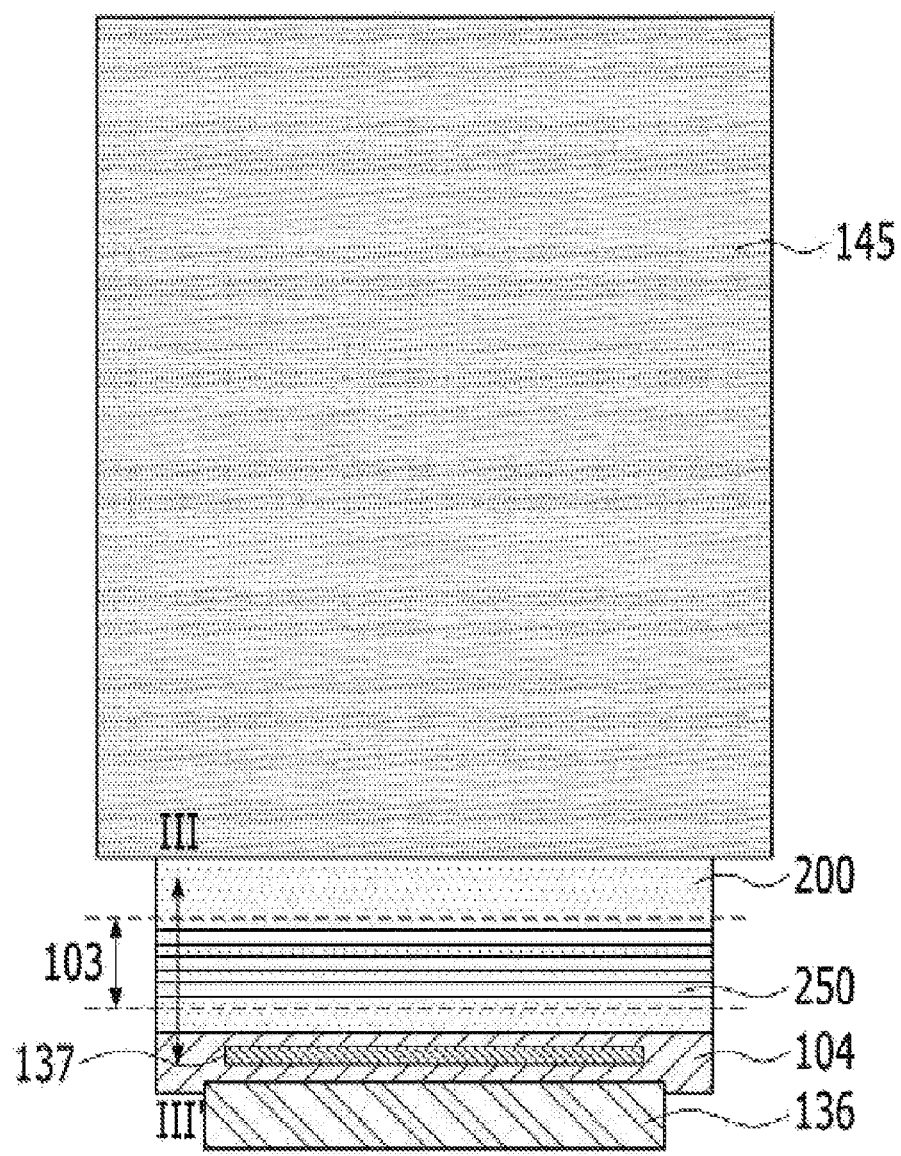
FIG. 5 is a view illustrating a layout of a display pane according to an embodiment of the present disclosure.
Figure 6:
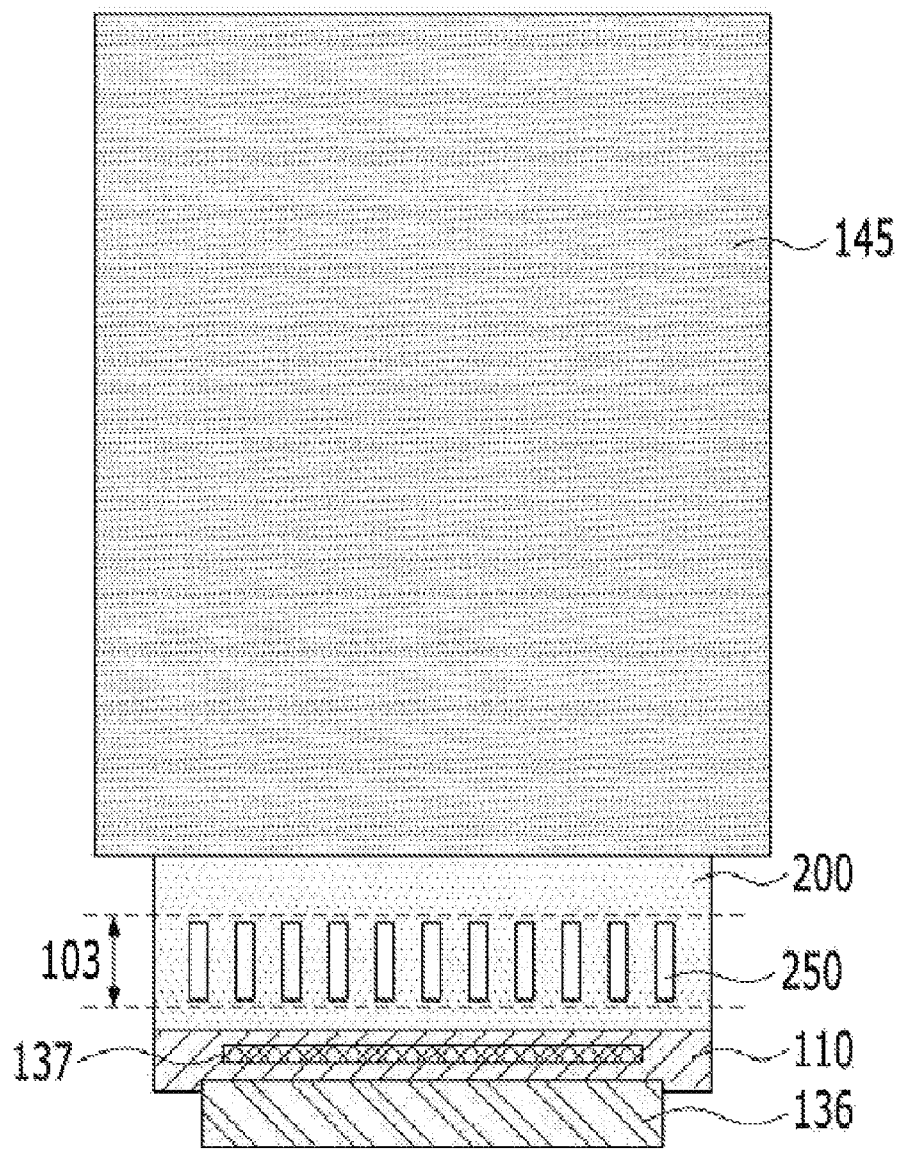
FIG. 6 is a view illustrating a layout of a display pane according to another embodiment of the present disclosure.
Figure 7:
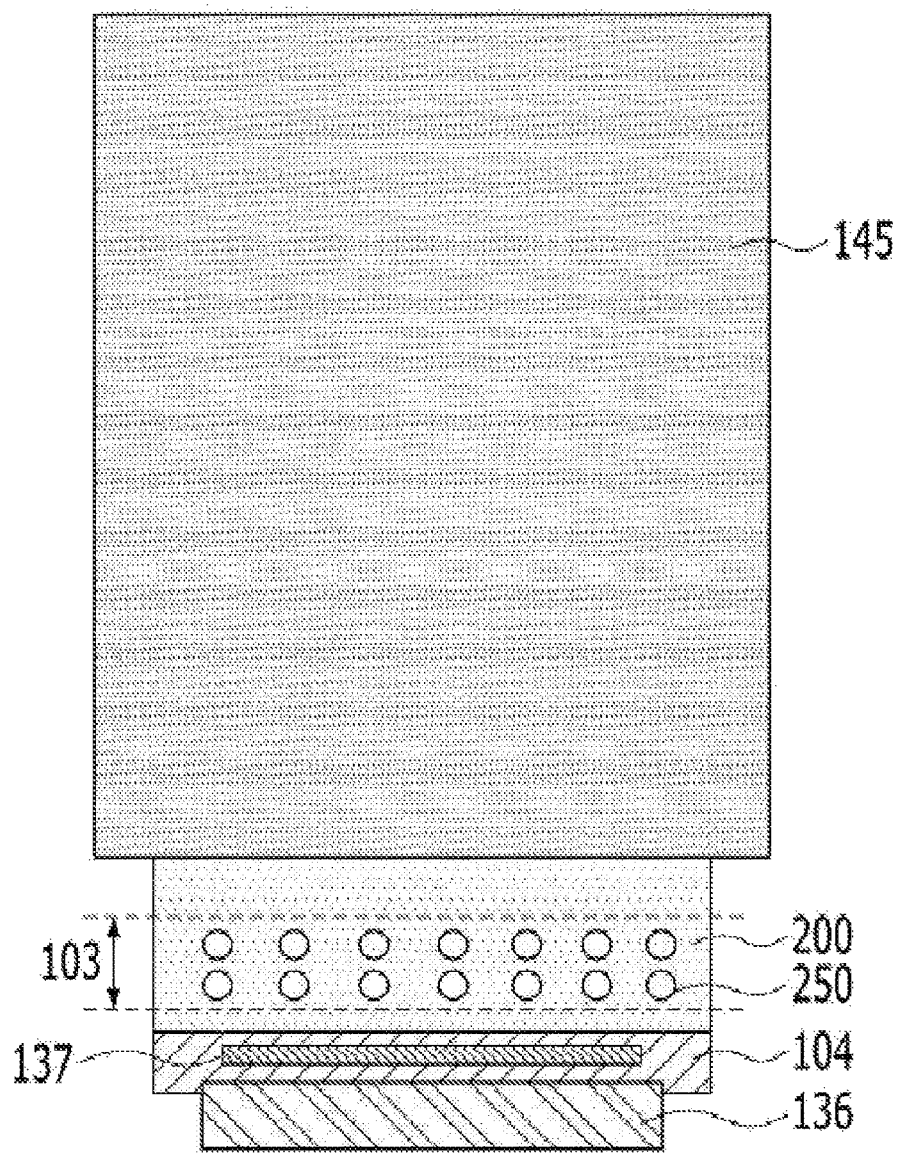
FIG. 7 is a view illustrating a layout of a display pane according to another embodiment of the present disclosure.
Figure 8:
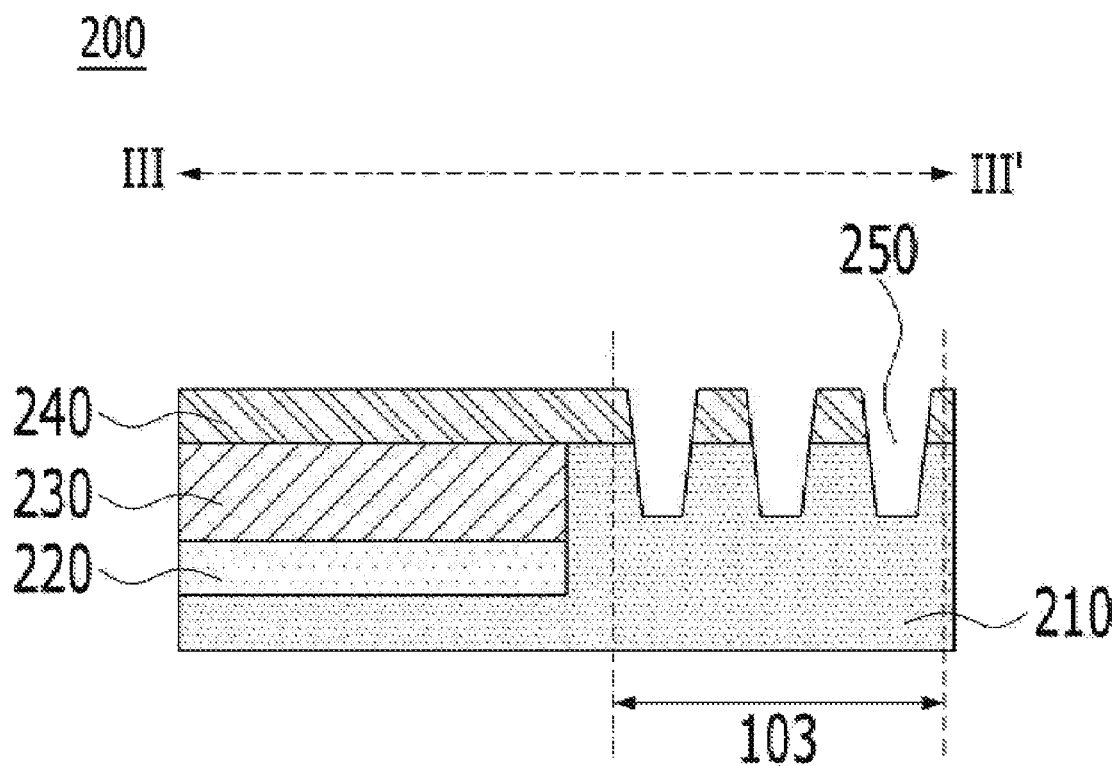
FIG. 8 is a cross-sectional view taken along line III-III' of FIG. 5, illustrating an embodiment of the present disclosure.
Figure 9:
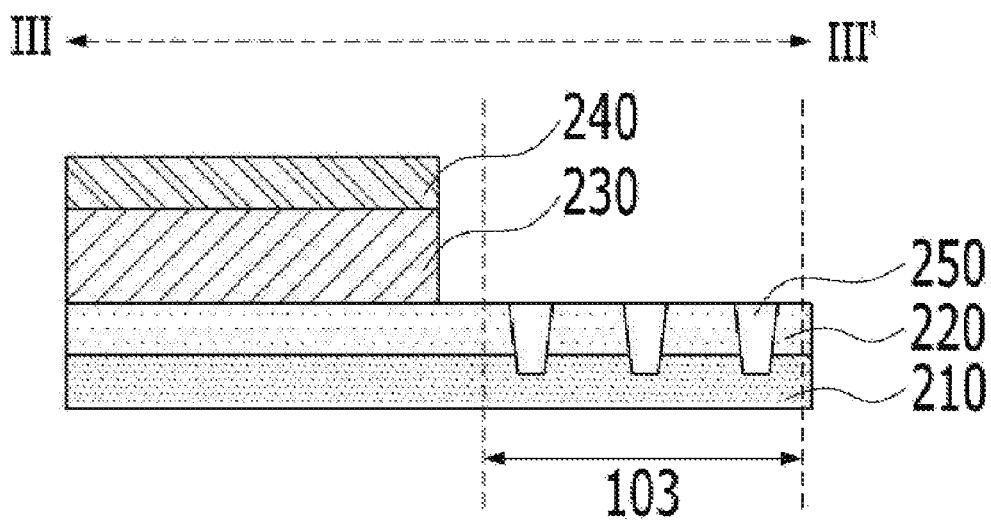
FIG. 9 is a cross-sectional view taken along line III-III' of FIG. 5, illustrating another embodiment of the present disclosure.
Figure 10:
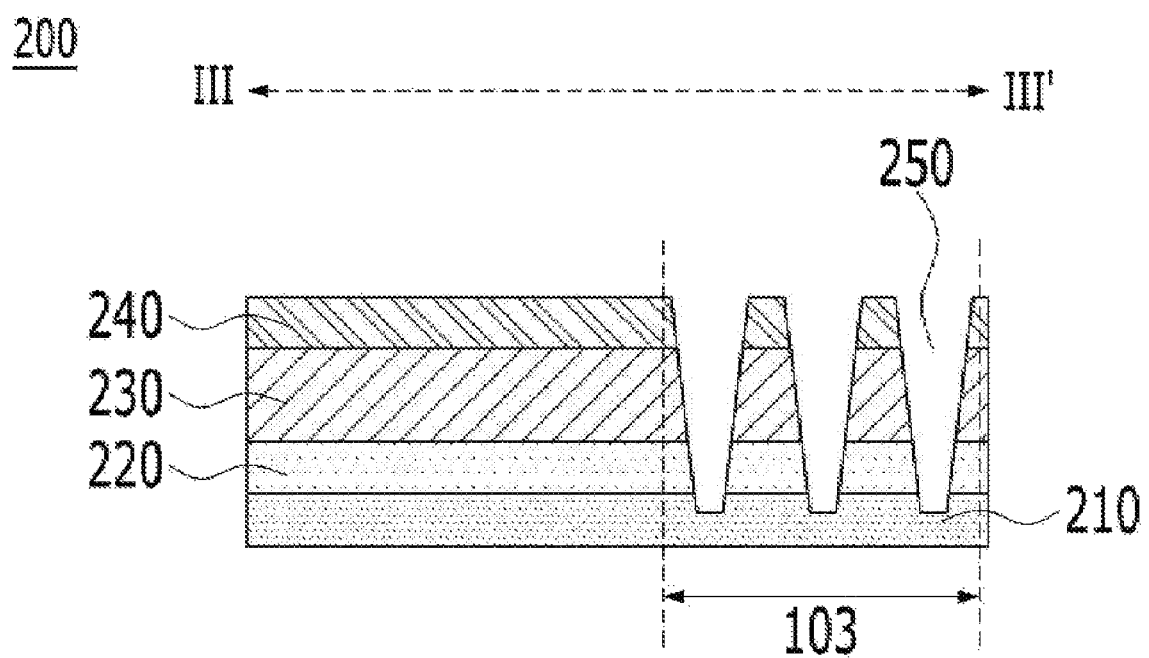
FIG. 10 is a cross-sectional view taken along line III-III' of FIG. 5, illustrating another embodiment of the present disclosure.
Figure 11:
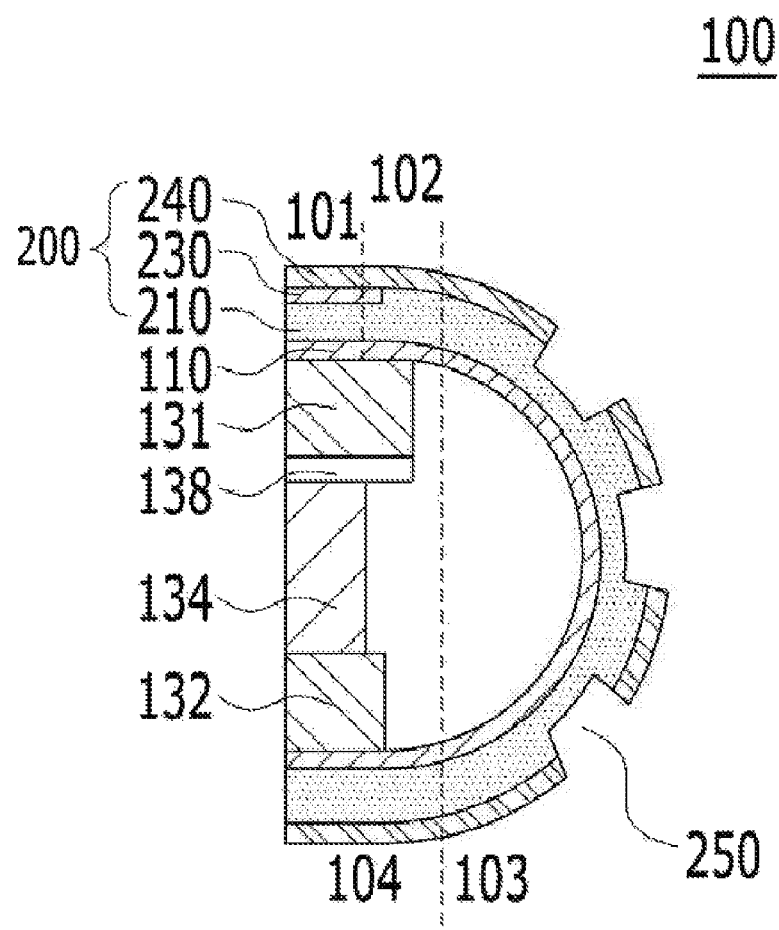
FIG. 11 is a view illustrating a cross-section of a display panel according to an embodiment of the present disclosure.
Figure 12:
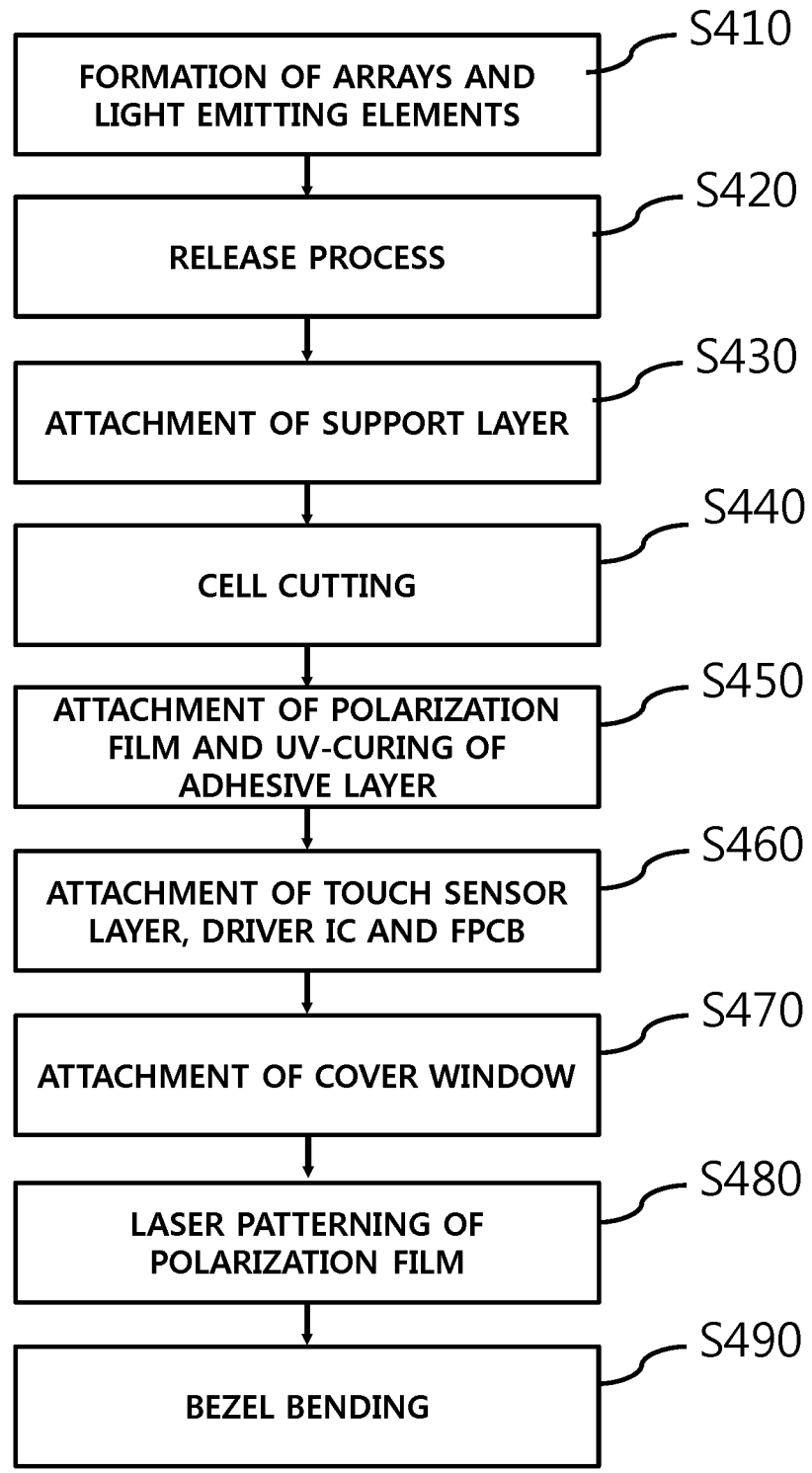
FIG. 12 is a view illustrating a process for manufacturing a display panel in accordance with an embodiment of the present disclosure.

FIG. 1 is a view illustrating a layout of a display panel according to an embodiment of the present disclosure. FIG. 2 is an enlarged plan view corresponding to an area II indicated by a dash-dotted line in FIG. 1, to show disposition of components around a notch area. FIG. 3 is a cross-sectional view taken along line I-I' of FIG. 1, to show a structure of a flexible substrate of FIG. 1 folded through bending. FIG. 4 is a view illustrating a laminated structure of a polarization film. FIG. 5 is a plan view illustrating an upper surface of the display panel, on which a polarization film according to an embodiment is disposed, to show arrangement of grooves in the polarization film. FIG. 6 is a plan view illustrating the upper surface of the display panel, on which a polarization film according to another embodiment is disposed, to show arrangement of grooves in the polarization film. FIG. 7 is a plan view illustrating the upper surface of the display panel, on which a polarization film according to an embodiment is disposed, to show arrangement of grooves in the polarization film. FIG. 8 is a view illustrating a cross-sectional structure of a polarization film according to an embodiment. FIG. 9 is a view illustrating a cross-sectional structure of a polarization film according to another embodiment. FIG. 10 is a view illustrating a cross-sectional structure of a polarization film according to another embodiment. FIG. 11 is a view illustrating a cross-section of a polarization film disposed in a bending area in accordance with an embodiment. FIG. 12 is a view illustrating a sequence of a process for manufacturing a display panel in accordance with an embodiment.

FIG. 1 illustrates the OLED display panel 100 which can be embodied in display apparatuses in the present disclosure. Referring to FIG. 1, the OLED display panel 100 can include at least one active area 101 in which light emitting elements 112 (FIG. 3) and arrays 111 (FIG. 3) are formed.

The display panel 100 can include inactive areas disposed around the active area 101. The inactive areas can include a first inactive area (a first area) 102 disposed at upper, lower, left and right sides of the active area 101, and a second inactive area (a second area) 104 disposed opposite to the active area 101 with reference to a bending area. The active area 101 can have a rectangular shape, without being limited thereto. For example, various display apparatuses having circular, oval and polygonal shapes can be applied to display apparatuses for a smartwatch and a vehicle. Therefore, arrangement of the first inactive area 102 and the second inactive area 104 surrounding the active area 101 is not limited to that of the OLED display panel. 100 illustrated in FIG. 1. In association with the OLED display panel 100 illustrated in FIG. 1, various components associated with driving of the light emitting elements 112 and the arrays 111 formed in the active area 101 are disposed in the first inactive area 102 positioned adjacent to the active area 101, to provide functions for light emission. For example, disposed in the first inactive area 102 can be circuits such as gate-in-panels (GIPs) 123 and electrostatic discharge (ESD) protection circuits 124, an area for providing contact between a cathode as a part of each light emitting element and a line 122 for a low-level voltage as a reference voltage of the light emitting element, and an encapsulation layer 113 for protecting the light emitting element 112 from moisture or foreign matter penetrating from the outside. In addition, disposed in the first inactive area 102 can be a plurality of dam structures for preventing the material of a foreign matter compensation layer included in the encapsulation layer 113 from overflowing beyond the display panel 100 during a process of coating the foreign matter compensation layer and a crack stopper structure for preventing cracks generated during a scribing process for dividing a mother substrate into individual display panels from being transferred to an inner portion of the display panel 100. The area where components are disposed, which is included in the first inactive area 102, can be referred to as a "first component formation part". The first component formation part can extend along a longer-axis surface of the active area 101, and can have an inclined surface in a bent state.

When impact generated at trimming lines of the substrate 110 during a scribing process reaches the GIPs 123, the ESD protection circuits 124 or the VSS lines 122 formed in the first inactive area 102, the GIPs 123, the ESD protection circuits 124 or the VSS lines 122 can break due to the impact. Furthermore, the impact can provide a moisture penetration path at the light emitting elements 112 or the arrays 111 formed in the active area 101, thereby causing growth of dark spots or occurrence of pixel shrinkage. In the present disclosure, the crack stopper structure 126 can prevent such phenomena occurring due to impact generated during a scribing process.

The crack stopper structure 126 can be constituted by an inorganic film or an organic film, without being limited thereto. In FIG. 1, the crack stopper structure 126 is illustrated as being disposed at both longer sides and one shorter side of the display panel 100, without being limited thereto. For example, the crack stopper structure 126 can also be disposed in a bending area 103 and areas where notches 151 are formed, respectively, such that the crack stopper structure 126 is disposed at all peripheral portions of the substrate 110.

In an area disposed adjacent to the trimming line of the substrate 110 outside the crack stopper structure 126, insulating films (a gate insulating (GI) layer, a buffer layer, and the like) deposited over the entire upper surface of the substrate 110 upon forming the active area can be partially or completely etched such that the insulating films are left in a small amount on the upper surface of the substrate 110 or the upper surface of the substrate 110 is completely exposed, in order to prevent scribing impact from being transferred to the insulating films.

Referring to FIG. 1, similarly to the first inactive area 102, various components associated with driving of the light emitting elements 112 and the arrays 111 formed in the active area 101 are disposed in the second inactive area 104, to provide functions for stable light emission. For example, a circuit board 136 electrically connected to a pad 135 formed for reception of external electric power, a data driving signal, etc. and reception and transmission of a touch signal can be disposed in the second inactive area 104. A VDD line 121, a VSS line 122 and/or voltage lines 127 for data can also be disposed in the second inactive area 104. The voltage lines 127 for data can also be referred to as "data voltage lines".

In the present disclosure, the voltage lines 127 for data can be disposed to be connected to a data driver IC 137 for generating an emission signal for each light emitting element 112.

The area where the pad 135 and the data driver IC 137 as described above are disposed, which is included in the second inactive area 104, can be referred to as a "second component formation part". In the second component formation part, the VDD line 121 and the VSS line 122 can be partially disposed in the second component formation part.

Referring to FIG. 1, notches 151 can be disposed at the display panel 100 in accordance with an embodiment of the present disclosure, for bending of the bending area 103, as indicated by a dash-dotted line. The notches 151 can be formed by trimming opposite lower corners of the display panel 100.

For example, during execution of a scribing process for dividing a mother substrate into individual panels, trimming is carried out to proceed from vicinities of the opposite lower corner areas toward an inside of the first inactive area 102 such that trimmed surfaces are disposed adjacent to the VDD line 121 or the VSS line 122.

In the present disclosure, the notches 151 extend from one end of the flexible substrate 110 and, as such, a bending process can begin from the vicinities of the notches 151 and can end in the vicinity of the data driver IC 137. Accordingly, the area of the flexible substrate 10 where the data driver IC 137 and the circuit board pad 135 are disposed can face a lower surface of a portion of the flexible substrate 110 at which the active area is formed.

Members connected to the pad 135 formed at an upper surface of the display panel 100 are not limited to the circuit board 136. Various members can be connected to the pad 135. The pad 135 can also be disposed at the upper surface of the display panel 100 or a lower surface of the display panel 100.

Although the data driver IC 137 is illustrated in FIG. 1 as being disposed at the upper surface of the display panel 100, the position of the data driver IC 137 is not limited thereto. The data driver IC 137 can be disposed at the lower surface of the display panel 100. Furthermore, members disposed at the upper surface of the display panel 100 are not limited to the data driver IC 137.

FIG. 2 is an enlarged view corresponding to a portion II of FIG. 1. Referring to FIG. 2, the area where one notch 151 is formed is shown in an enlarged state. FIG. 2 shows components such as the bending area 103, the first inactive area 102 and the second inactive area 104 before execution of a bending process.

In the display panel 100 including the active area 101, the first inactive area 102 disposed to surround the active area 101, the bending area 103 and the second inactive area 104 extending from the bending area 103, two opposite lower corners of the flexible substrate 110 where the first inactive area 102, the bending area 103 and the second inactive area 104 are present are trimmed in inward directions for formation of the notches 151, thereby forming substrate trimming lines as illustrated in FIG. 2. When the area of the substrate bent during a bending process is reduced in association with realization of a slim bezel or a narrow bezel, enhanced processability can be obtained because stress, to which the substrate is subjected, is reduced. In addition, crack stopper structures 126 can be formed inside of the substrate along trimmed surfaces, respectively, in order to avoid propagation of cracks possibly created during a scribing process. Each trimmed surface of the substrate can be formed to have a round corner and, as such, processability and durability can be enhanced.

The GIPs 123, the ESD protection circuits 124, etc. can be disposed at lateral sides of the active area 101 so as to be arranged along a peripheral portion of the VSS line 122. In association with a gate signal, a low-level voltage VSS, a high-level voltage VDD, and external power, which is applied to the pad 135 disposed in the second inactive area 104, can be introduced into the first inactive area 102 after passing through the bending area 103 via the VDD line 121, the data voltage lines 127, and a gate power line 125. In association with a data signal, power applied to the pad 135 disposed in the second inactive area 104 is converted into a data signal, and is then introduced into the active area 101 after passing through the bending area 103 via the data voltage lines 127. Since such various lines extend through the bending area 103, most of the lines can be subjected to tension and shrinkage stresses during execution of a bending process and, as such, can be broken due to stress concentration on specific points thereof. As a result, the display panel 100 can have defects causing malfunction. To this end, it can be important to avoid stress concentration on a specific area of the flexible substrate 110 in order to protect the lines in the bending area 103.

FIG. 3 is a cross-sectional view taken along line I-I' of FIG. 1. For example, FIG. 3 is a cross-sectional view emphasizing a cross-section of the display panel 100 in a state in which the inactive area thereof is bent. FIG. 3 shows the active area as including the flexible substrate 110, and the arrays 111, the light emitting elements 112 and the encapsulation layer 113, which can be formed on the flexible substrate 110. A support layer 131 can be disposed at a lower surface of the flexible substrate 110. In FIG. 3, the arrays 110, that is, thin film transistor (TFT) arrays, and the light emitting elements 112 are shown as being flat. The encapsulation layer 113 can be configured to have a triple-layer structure of inorganic film/organic film/inorganic film. Of course, the encapsulation layer 113 is not limited to the triple-layer structure, and can have a five-layer structure or a multilayer structure including more than five layers. In FIG. 3, the encapsulation layer 113 is shown as a single layer.

The flexible substrate 110 can be made of, for example, a polyimide resin-based material, without being limited thereto.

In the present disclosure, the encapsulation layer 113 can be disposed over the entirety of the active area 101 and can extend up to the first inactive area 102 surrounding the active area 101, in order to protect the light emitting elements 112 that are susceptible to moisture and dust.

In the present disclosure, the encapsulation layer 113 can have a triple-layer structure of inorganic film/organic film/inorganic film. The inorganic films can be made of an Si-based material such as $SiN_x$, $SiO_x$ or SiON.

The organic film applied to the encapsulation layer 113 can be referred to as a "particle capping layer (PCL)". The organic film can be made of a material such as epoxy resin which is a kind of polymer, without being limited thereto. Each inorganic film can have a multilayer structure of, for example, $SiN_x$/SiON, in place of a single-layer structure. Each inorganic film can have a thickness of about 0.5 to 1 µm. The organic film can have a thickness of 7 to 20 µm. The thicknesses of the organic and inorganic films are not limited to the above-described values.

In the present disclosure, a polarization film 200 can be disposed on the encapsulation layer 113. The polarization film 200 can have a function for minimizing influence of light generated from an external light source on the light emitting elements 112 in a state of being introduced into the display panel 100. In FIG. 3, the polarization film 200 is illustrated as including a third adhesive layer 210 and a first protective layer 220, without being limited thereto. For example, the polarization film 200 can further include a polarizer 230, a second protective layer 240, a third protective layer 270, and a release film 260. A laminated structure of the polarization film 200 will be described later in detail in conjunction with description given with reference to FIG. 4. The polarization film 200 can be disposed to cover the active area 101 and the first inactive area 102 while extending up to the bending area 103 and at least a portion of the second inactive area 104. By virtue of the polarization film 200 extending up to the bending area 103 and the second inactive area 104, the data voltage lines 127, the VSS line 122, the VDD line 121, the gate power lines 125, etc., which are disposed in the bending area 103, can be protected from external impact and ambient moisture. Although not shown in FIG. 3, the polarization film 200 can be attached after being cut to have the same outline as the notches 151 formed in areas where the first inactive area 102, the bending area 103 and the second inactive area 104 are present, as illustrated in FIG. 1 or 2.

FIG. 3 illustrates a touch sensor layer 142 for sensing touch. The touch sensor layer 142 can include an electrostatic touch sensor layer. A first adhesive layer 141 can be disposed beneath the touch sensor layer 142, for attachment of the touch sensor layer 142 to the polarization film 200. Embodiments of the present disclosure are not limited to a touch structure as described above. Embodiments of the present disclosure can also be applied to a touch-on-encapsulation (TOE) structure in which an electrostatic touch sensor layer is formed on the encapsulation layer 113 without disposition of the touch sensor layer 142.

In the present disclosure, a second adhesive layer 143 and a decorative film 144 can be disposed on the touch sensor layer 142. A cover window 145 can also be attached to an outermost surface of the display panel 100 in order to protect the display panel 100 from external environments.

In the present disclosure, the decorative film 144 is disposed at the top of the display panel 100 in order to hide the first inactive area 102 disposed outside the active area 101 from the view of the user such that the user can view only the active area 101. In this regard, the decorative film 144 can have an aesthetic function. The decorative film 144 can also protect the components disposed in the first inactive area 102 from an external light source.

A first support layer 131 can be disposed at the bottom of the flexible substrate 110 or the lower surface of the flexible substrate 110. The first support layer 131 can have thickness of, for example, 100 to 125 µm, 50 to 150 µm, 75 to 200 µm, less than 150 µm, or more than 100 µm, without being limited thereto. The first support layer 131 can be made of, for example, polyethylene terephthalate (PET), without being limited thereto. A metal layer 138 (FIG. 11) can be additionally disposed beneath the first support layer 131. The reason why the metal layer 138 is additionally disposed is as follows. Noise can be generated in batteries or semiconductor chips of modules attached to the display panel 100. Due to such noise, electromagnetic interference (EMI) can be generated in the display panel 100. Such EMI can cause malfunction of the TFTs or OLEDs of the arrays 111 or abnormality of a display screen. In order to avoid such phenomena, the metal layer 138, which has a thickness of about 0.1 mm, is disposed. Thus, an effect of shielding EMI can be provided. An additional metal layer 138 can also be disposed in order to provide a heat dispersion effect capable of dispersing heat generated from a light source of the display panel 100 and a rigidity effect capable of more firmly supporting the flexible substrate 110.

The circuit board 136 and the pad 135 associated therewith can be provided at one end of the flexible substrate 110. When a bending process is executed, the circuit board 136, which is attached to the pad 135, is disposed behind the screen of the active area 101 and, as such, the size of the display panel 100 can be reduced.

Despite being formed on the upper surface of the flexible substrate 110, the driver IC 137, the pad 135 and the circuit board 136 electrically connected to the pad 135 can be disposed at a side opposite to the active area 101 in accordance with bending.

A second support layer 132 can be disposed beneath the second inactive area 104, for the same reason as the first support layer 131 disposed in the active area 101 and the first inactive area 102 to support the flexible substrate 110. In accordance with disposition of the second support layer 132, it can be possible to secure process stability during attachment of the driver IC 137 to be disposed at an upper surface of the second inactive area 104 and the circuit board 136 to be connected to the pad 135.

A double-sided tape 134 can be disposed in a space defined between portions of the flexible substrate 110 facing after bending of the flexible substrate 110 such that the double-sided tape 134 is disposed beneath the first support layer 131 or the metal layer 138, in order to maintain the bent state of the flexible substrate 110. The double-sided tape 134 is disposed between the bottom of the first support layer 131 or the metal layer 138 and the top of the second support layer 132. Accordingly, the first support layer 131 or the metal layer 138 and the second support layer 132 are attached to each other and, as such, can be fixed to each other. The double-sided tape 134 can be constituted by a foam tape, without being limited thereto. For example, the double-sided tape 134 can include a pressure-sensitive adhesive, a foam type adhesive, a liquid adhesive, a light-curable adhesive, or any other suitable ingredients. The double-sided tape 134 can be made of a compressive material or can include a compressive material. The double-sided tape 134 can function as a cushion for elements coupled by the double-sided tape 134. In addition, the double-sided tape 134 can have a multilayer structure including upper and lower layers made of an adhesive material and a cushion layer interposed between the upper and lower layers and made of, for example, a polyolefin foam.

FIG. 4 is a view illustrating a laminated structure of the polarization film 200 according to an embodiment of the present disclosure. In the present disclosure, the polarization film 200 is an element of a display and, as such, will be described in conjunction with a liquid crystal display panel and an organic light emitting display apparatus. Of course, the polarization film 200 is not limited to the liquid crystal display panel and the organic light emitting display apparatus. In the liquid crystal display panel, the polarization film 200 can be disposed at each of upper and lower surfaces of a liquid crystal layer such that light vibrating in the same direction as a polarization axis is allowed to pass through the polarization film 200, and light vibrating in a direction different from the polarization axis is absorbed or reflected by the polarization film 200. In this case, accordingly, the polarization film 200 can function to produce light polarized in a specific direction. For example, the polarization film 200 can be used to change the vibration axis direction of incident light or to prevent change of the vibration axis direction of the incident light through determination of vertical polarization or horizontal polarization, thereby allowing or preventing passage of the light therethrough. The polarization film 200 can be used in a filter for specific effects of a camera or a glass for stereoscopic movies in accordance with the above-described properties. Differently from the liquid crystal display panel, in the organic light emitting display apparatus, the polarization film 200 can be used to correctly render a black screen in a state in which light emitting elements in a panel are completely turned off, that is, in an OFF state of the light emitting elements. In addition, the polarization film 200 can be used to enhance outdoor visibility of the organic light emitting display apparatus, in order to enable the user to distinctly recognize a display screen in spite of presence of a strong outdoor light source, that is, sunlight, when the user views an image displayed on the organic light emitting display apparatus outdoors. When light from an outdoor light source having brightness that is several tens of times or several hundreds of times that of an indoor light source is reflected from the panel after being incident upon the panel, the user can have difficulty recognizing the image on the screen because light emitted from the organic light emitting display apparatus has relatively low intensity. Prevention of such reflection of light of the outdoor light source from the panel can be achieved by disposition of the polarization film 200. The polarization film 200 can be manufactured to have a total of 6 layers. The polarization film 200 can include a polarizer 230 serving to change light to linearly-polarized light, and first and second protective layers 220 and 240 respectively disposed at upper and lower surfaces of the polarizer 230, to protect the polarizer 230. The first protective layer 220 and the second protective layer 240 can be made of the same material. A triacetylcellulose (TAC) film can be used for the first and second protective layers 220 and 240. The third protective layer 270 can be disposed on the second protective layer 240. The third adhesive layer 210 and the release film 260 can be disposed beneath the first protective layer 220. The third protective layer 270 is disposed for additional protection of the polarization film 200. The third adhesive layer 210 is disposed for attachment of the polarization film 200 to the upper surface of the display panel 100. The third protective layer 270 and the release film 260 function to prevent impurities from being attached to the third adhesive layer 210 until the polarization film 200 is attached to the display panel 100 after manufacture thereof, and can be removed when attachment of the polarization film 200 to the display panel 100 is executed. Although the first protective layer 220 and the second protective layer 240 are described in the present disclosure as being simultaneously used, it is unnecessary to use both the first protective layer 220 and the second protective layer 240. Only one of the first and second protective layers 220 and 240 can be selectively used. The TAC film selected as the protective layers can be used to protect the polarizer 230. For example, when the TAC film has a thickness of about 25 μm, the TAC film can have a hardness of about 1 to 3 H. Here, "hardness" means strength or resistance against abrasion or scratch. A higher value of hardness means higher strength or resistance against scratch or reduced formation of scars. Microcoating layers, which are conventionally used to protect circuits disposed in the bending area, can be stripped or can become loose due to external impact or stress because such microcoating layers have a property as an organic film. In an embodiment of the present disclosure, the TAC film has a sufficient hardness to provide abrasion resistance remarkably greater than those of organic films conventionally used as a microcoating layer, to enable the TAC film to withstand impact and stresses applied to the bending area 103, and to protect various lines disposed in the bending area 103. This will be further described later with reference to FIG. 5, etc.

FIG. 5 is a view illustrating a layout of the display panel 100 according to an embodiment of the present disclosure. The layout of FIG. 5 shows a state in which the circuit board 136, the polarization film 200 and the cover window 145 are further disposed on the display panel 100 illustrated in FIG. 1, and no bending process has been carried out. As illustrated in FIG. 5, the polarization film 200 can be disposed not only to cover the active area 101 and the first inactive area 102, but also to extend up to the bending area 103 and a portion of the second inactive area 104 such that the polarization film 200 covers the bending area 103 and the portion of the second inactive area 104. As the second protective layer 240, which is one of the plural films constituting the polarization film 200, has a high hardness of about 1 to 3 H, it can be possible to protect various lines disposed in the bending area 103 from external impact and stress. Referring to FIG. 5, the circuit board 126 is disposed in the second inactive area 104 while being connected to the driver IC 137 and the pad 135, and the cover window 145 is disposed in the active area 101 and the first inactive area 102. A plurality of grooves 250 or concave portions and convex portions can be provided at a portion of the polarization film 200 disposed in the bending area 103. The reason why the plural grooves 250 are provided at the portion of the polarization film 200 disposed in the bending area 103 is to efficiently execute a bending process. The physical properties of the TAC film used as the first protective layer 220 or the second protective layer 240, which is disposed to protect the lines in the bending area 103, can serve as important parameters in the bending process. The elastic modulus or Young's modulus of the TAC film is considerably greater than that of microcoating layers. To this end, the elastic modulus of the TAC film is reduced by forming a plurality of grooves 250 at the TAC film in association with bending of the bending area 103 and, as such, it can be possible to easily perform a bending process. Contents as to elastic modulus will be described later in detail with reference to FIG. 4. FIG. 5 illustrates that the plural grooves 250 formed at the portion of the polarization film 200 in the bending area 103 are arranged in the form of 3 lines extending in a longer-axis direction parallel to the direction in which the driver IC 137 extends. When the plural grooves 250 are arranged to extend in the longer-axis direction parallel to the drive IC 137, the grooves 250 are disposed to be perpendicular to the direction of tension stress applied to the second protective layer 240 of the polarization film 200 in the bending area 103 during bending, thereby minimizing the elastic modulus of the second protective layer 240 such that the bending area 103 can have a predetermined radius of curvature. The number and width of the grooves 250 disposed to optimize the elastic modulus of the second protective layer 240 can be varied. The plural grooves 250 can be patterns of a uniform width formed at at least one of the first protective layer 220, the polarizer 230, the second protective layer 240 and the third adhesive layer 210 through laser patterning. The number of the grooves 250, the layer where the grooves 250 are disposed, and the patterning method are not limited to the illustrated embodiment. The plural grooves 250 of the polarization film 200 are recommended to be disposed in the bending area 103. Of course, the grooves 250 can be formed in an area outside the bending area 103. Line III-III' in FIG. 5 is adapted to show a cross-section taken therealong in a bent state of the display panel 100.

FIG. 6 is a view illustrating a layout of the display panel 100 according to another embodiment of the present disclosure. The layout of FIG. 6 shows a state in which the circuit board 136, the polarization film 200 and the cover window 145 are further disposed on the display panel 100 illustrated in FIG. 1, and no bending process has been carried out. As illustrated in FIG. 6, the polarization film 200 can be disposed not only to cover the active area 101 and the first inactive area 102, but also to extend up to the bending area 103 and a portion of the second inactive area 104 such that the polarization film 200 covers the bending area 103 and the portion of the second inactive area 104. As the second protective layer 240, which is one of the plural films constituting the polarization film 200, has a high hardness of about 1 to 3 H, it can be possible to protect various lines disposed in the bending area 103 from external impact and stress. Referring to FIG. 6, the circuit board 126 is disposed in the second inactive area 104 while being connected to the driver IC 137 and the pad 135, and the cover window 145 is disposed in the active area 101 and the first inactive area 102. A plurality of grooves 250 can be provided at a portion of the polarization film 200 disposed in the bending area 103. FIG. 6 illustrates that the plural grooves 250 formed at the portion of the polarization film 200 in the bending area 103 are arranged in the form of 11 lines extending in a shorter-axis direction perpendicular to the direction in which the driver IC 137 extends. When the plural grooves 250 are arranged to extend in the shorter-axis direction perpendicular to the drive IC 137, the grooves 250 are disposed to be parallel to the direction of tension stress applied to the second protective layer 240 of the polarization film 200 in the bending area 103 during bending and, as such, the number of the grooves 250 can be maximized. Furthermore, the second protective layer 240 can have an optimal elastic modulus such that the bending area 103 can have a predetermined radius of curvature. The number and width of the grooves 250 disposed to optimize the elastic modulus of the second protective layer 240 can be varied. The plural grooves 250 can be patterns of a uniform width formed at at least one of the first protective layer 220, the polarizer 230, the second protective layer 240 and the third adhesive layer 210 through laser patterning. The number of the grooves 250, the layer where the grooves 250 are disposed, and the patterning method are not limited to the illustrated embodiment. The plural grooves 250 of the polarization film 200 are recommended to be disposed in the bending area 103. Of course, the grooves 250 can be formed in an area outside the bending area 103.

FIG. 7 is a view illustrating a layout of the display panel 100 according to another embodiment of the present disclosure. The layout of FIG. 7 shows a state in which the circuit board 136, the polarization film 200 and the cover window 145 are further disposed on the display panel 100 illustrated in FIG. 1, and no bending process has been carried out. As illustrated in FIG. 7, the polarization film 200 can be disposed not only to cover the active area 101 and the first inactive area 102, but also to extend up to the bending area 103 and a portion of the second inactive area 104 such that the polarization film 200 covers the bending area 103 and the portion of the second inactive area 104. As the second protective layer 240, which is one of the plural films constituting the polarization film 200, has a high hardness of about 1 to 3 H, it can be possible to protect various lines disposed in the bending area 103 from external impact and stress. Referring to FIG. 7, the circuit board 126 is disposed in the second inactive area 104 while being connected to the driver IC 137 and the pad 135, and the cover window 145 is disposed in the active area 101 and the first inactive area 102. A plurality of grooves 250 can be provided at a portion of the polarization film 200 disposed in the bending area 103. The plural grooves 250 provide an effect of reducing the elastic modulus of the polarization film 200 such that the bending area 103 can have a desired radius of curvature during execution of a bending process. In order to reduce the elastic modulus of the polarization film 200 disposed in the bending area 103, plural circular grooves 250, which are arranged at a uniform interval while having a predetermined size, can be disposed at the portion of the second protective layer 240 in the bending area 103, to expose the third adhesive layer 210. In this case, the elastic modulus of the second protective layer 240 can be reduced corresponding to a reduced area of the second protective layer 240. The plural grooves 250 can be patterns of a uniform width formed at at least one of the first protective layer 220, the polarizer 230, the second protective layer 240 and the third adhesive layer 210 through laser patterning. FIG. 7 illustrates that the plural grooves 250 formed at the portion of the polarization film in the bending area 103 are arranged in two rows in the form of dots. Although the plural grooves 250 are illustrated as having a circular shape, the grooves 250 can have various shapes such as a quadrangular shape and a triangular shape. The number of the grooves 250, the layer where the grooves 250 are disposed, and the patterning method are not limited to the illustrated embodiment.

FIG. 8 is a cross-sectional view illustrating a cross-sectional structure of the polarization film 200 according to an embodiment of the present disclosure. The cross-sectional view of FIG. 8 illustrates, mainly in conjunction with the bending area 103, a cross-sectional structure of the polarization film 200 before or after attachment of the polarization film 200 to the display panel 100. FIG. 8 is a cross-sectional view taken along line III-III' of FIG. 5. For example, although the polarization film 200 has, in the active area 101 and the first inactive area 102, a configuration including all of the third adhesive layer 210, the first protective layer 220, the polarizer 230 and the second protective layer 240, the polarizer 230 and the first protective layer 220 are removed from a portion of the polarization film 200 in an area extending from the first inactive area 120 to the second inactive area 104 via the bending area 103 such that only the third adhesive layer 210 and the second protective layer 240 can be present at the portion of the polarization film 200. A plurality of grooves 250 can be disposed at portions of the third adhesive layer 210 and the second protective layer 240 in the bending area 103. The plural grooves 250 can be patterned using a laser before or after attachment of the polarization film 200 to the display panel 100. The reason why the grooves 250 are formed at the second protective layer 240 is to reduce the elastic modulus of the TAC film used as the second protective layer 240, thereby achieving efficient execution of the bending process. The TAC film has a high elastic modulus of about 3 to 4.5 MPa when the TAC film has a thickness of 20 μm. In the case of a microcoating layer, it can have an elastic modulus of about 0.5 to 1 MPa at a thickness of 120 μm. Due to such a high elastic modulus of the TAC film, it is necessary to generate sufficiently high stress to overcome the elastic modulus in a bending process. Furthermore, elastic recovery force exhibited after the bending process to recover the polarization film 200 from a bent state is high. To this end, it is necessary to reduce the elastic modulus of a portion of the TAC film disposed in the bending area 103. Although the polarization film 200 is illustrated as having a laminated structure including the third adhesive layer 210, the first protective layer 220, the polarizer 230 and the second protective layer 240, the polarization film 200 is not limited thereto. For example, the polarization film 200 need not include the first protective layer 200. It is noted that the plural grooves 250 have a depth determined to cause the grooves 250 to extend to the third adhesive layer 210 through the second protective layer 240, thereby resulting in exposure of the third adhesive layer 210. Of course, the grooves 250 are not limited to the above-described condition. For example, the plural grooves 250 can be formed to barely expose the third adhesive layer 210, or can be formed to penetrate partway into a thickness of the third adhesive layer 210. In embodiments, the plural grooves 250 can penetrate into the third adhesive layer 210 at various depths. For example, the plural grooves 250 can penetrate up to halfway into the third adhesive layer 210, or more than halfway into the third adhesive layer 210. In embodiments, the third adhesive layer 210 can be or not be perforated while the other layers including second protective layer 240 can be perforated. Also, the plural grooves 250 can have a shape that becomes narrower as a penetration into the third adhesive layer 210 become deeper, but such is not required and the plural grooves 250 can have the same with regardless of depth or can have a profile that becomes wider as the penetration into the third adhesive layer 210 become deeper.

FIG. 9 is a cross-sectional view illustrating a cross-sectional structure of the polarization film 200 according to another embodiment of the present disclosure. The cross-sectional view of FIG. 9 illustrates, mainly in conjunction with the bending area 103, a cross-sectional structure of the polarization film 200 before or after attachment of the polarization film 200 to the display panel 100. FIG. 9 is a cross-sectional view taken along line III-III' of FIG. 5. For example, although the polarization film 200 has, in the active area 101 and the first inactive area 102, a configuration including all of the third adhesive layer 210, the first protective layer 220, the polarizer 230 and the second protective layer 240, the polarizer 230 and the second protective layer 240 are removed from a portion of the polarization film 200 in an area extending from the first inactive area 120 to the second inactive area 104 via the bending area 103 such that only the third adhesive layer 210 and the first protective layer 220 can be present at the portion of the polarization film 200. A plurality of grooves 250 can be disposed at portions of the third adhesive layer 210 and the first protective layer 220 in the bending area 103. The plural grooves 250 can be patterned using a laser before or after attachment of the polarization film 200 to the display panel 100. The reason why the grooves 250 are formed at the third adhesive layer 210 and the first protective layer 220 is the same as the reason described in conjunction with FIG. 8 and, as such, no description thereof will be given. It is noted that the plural grooves 250 have a depth determined to cause the grooves 250 to extend to the third adhesive layer 210 through the first protective layer 220, thereby resulting in exposure of the third adhesive layer 210. Of course, the grooves 250 are not limited to the above-described condition.

FIG. 10 is a cross-sectional view illustrating a cross-sectional structure of the polarization film 200 according to another embodiment of the present disclosure. The cross-sectional view of FIG. 10 illustrates, mainly in conjunction with the bending area 103, a cross-sectional structure of the polarization film 200 before or after attachment of the polarization film 200 to the display panel 100. FIG. 10 is a cross-sectional view taken along line III-III' of FIG. 5. For example, the polarization film 200 has, in the active area 101 and the first inactive area 102, a configuration including all of the third adhesive layer 210, the first protective layer 220, the polarizer 230 and the second protective layer 240, and the laminated structure extends up to the second inactive area 104 via the bending area 103. A plurality of grooves 250 can be formed in the bending area 103 to extend through the second protective layer 240, the polarizer 230 and the first protective layer 220. Although the plural grooves 250 are illustrated as extending through the first protective layer 220, the polarizer 230 and the second protective layer 240, the grooves 250 are not limited to the above-described condition. For example, the plural grooves 250 can be formed to extend through the second protective layer 240 and the polarizer 230.

FIG. 11 is a view illustrating a cross-section of the display panel 100 according to the embodiment of FIG. 8. Although the TFT arrays 111, the light emitting elements 112, the polarization film 200, the first adhesive layer 141, the touch layer 142, the second adhesive layer 143, the decorative film 144 and the cover window 145 can be laminated on the flexible substrate 110, these elements are omitted from FIG. 11. The display panel 100 can have a laminated structure formed beneath the flexible structure 110 while including the first support layer 131, the metal layer 138 as a conductive film, the double-sided tape 134 and the second support layer 132. FIG. 11 also illustrates that the polarization film 200 extends along the bending area 103, together with the flexible substrate 110, and the plural grooves 250 are disposed at the polarization film 200. FIG. 11 also illustrates that the third adhesive layer 210, the polarizer 230 and the second protective layer 240 constituting the polarization film 200 extend along the active area 101 and the first inactive area 102. The polarizer 230 is not disposed in the first inactive area 102. A portion of the polarization film 200, which is constituted by the third adhesive layer 210 and the second protective layer 240, extends to the second inactive area 104 via the bending area 103. The plural grooves 250, which are formed through removal of at least portions of the second protective layer 240 and the third adhesive layer 210 from the bending area, are widened during execution of a bending process and, as such, can absorb tension stress applied to the polarization film 200. Although FIG. 11 exemplarily illustrates the polarization film 200 according to the embodiment of FIG. 8, the present disclosure is not limited thereto. The embodiments illustrated in other drawings can also be applied to the configurations described with reference to FIG. 11. The plural grooves 250 of FIG. 11 can also be referred to as "concave portions and convex portions".

FIG. 12 is a view illustrating a process for manufacturing a display panel according to an embodiment of the present disclosure. In accordance with the process, the TFT arrays 111, the organic light emitting elements 112 and the encapsulation layer 113, as basic elements, can be formed on the flexible substrate 110 formed over a glass substrate (S410).

A temporary protective film (TPF) can then be attached to an upper surface of the encapsulation layer 113 in order to prevent damage to the encapsulation layer 113 possibly occurring during execution of a subsequent process and to protect the organic light emitting elements 112, etc. from external factors, and a release process for separating the flexible substrate 110 from the glass substrate can be subsequently carried out (S420).

In order to reinforce rigidity of the flexible substrate 110 separated from the glass substrate for execution of a subsequent process such as attachment of the polarization film 200, the touch sensor layer 142, the driver IC 137 and the cover window 145, the support layer 131 can be attached to a lower surface of the flexible substrate 110 (S430).

Under the condition that the flexible substrate 110 is reinforced by the support layer 131, for rigidity, and has the form of a mother substrate including a plurality of assembled cells, the flexible substrate 110 can then be subjected to primary laser cutting for individual cells thereof and, as such, can be divided in units of display panels 100 (S440).

Subsequently, the TPF temporarily attached to the upper surface of the encapsulation layer 113 can be removed. The polarization film 200 can be attached to the resultant structure, to cover the active area 101 and a portion of the inactive area 102. Thereafter, the third adhesive layer 210 of the polarization film 200 can be cured using ultraviolet (UV) light or heat (S450).

The portion of the attached polarization film 200 disposed in the bending area 103 can be formed with a plurality of grooves using a laser. Removal of a portion of the first protective layer 220 or the second protective layer 240 corresponding to the bending area 103 using a laser can be executed before or after attachment of the polarization film 200 to the display panel 100. FIG. 12 illustrates execution of the laser-based removal process after attachment of the polarization film 200 to the display panel 100 (S480). However, the present disclosure is not limited to the embodiment of FIG. 12.

Thereafter, the first adhesive layer 141 and the touch sensor layer 142 can be attached to the flexible substrate 110 in the active area 101, and the driver IC 137 and an FPCB as the circuit board 136 can also be attached to the flexible substrate 110 in the inactive area (S460).

The second adhesive layer 143, the decorative film 144 and the cover window 145 can be subsequently attached to the upper surface of the polarization film 200 (S470). Thus, attachment of films needed for the display panel 100 can be completed.

The flexible substrate 110 can be bent through a bezel bending process such that the flexible substrate 110 has a predetermined radius of curvature (S490). Thus, the final, process in the manufacture procedure of the display panel 100 can be completed.

The display apparatus according to each embodiment of the present disclosure can include a liquid crystal display (LCD) apparatus, a field emission display (FED) apparatus, an organic light emitting display (OLED) apparatus, and a quantum dot (QD) display apparatus.

The display apparatus according to each embodiment of the present disclosure can include equipment apparatuses including complete products or final products of LCM and OLED modules, for example, a notebook computer, a television, a computer monitor, an automotive apparatus, or other type apparatuses for vehicles, and set electronic apparatuses or set apparatuses such as mobile electronic apparatuses, for example, a smart phone and a tablet.

The display apparatus according to each embodiment of the present disclosure can be explained as follows.

The display apparatus according to an embodiment of the present disclosure can include a flexible substrate including an active area and an inactive area, the inactive area including a first area disposed adjacent to the active area, a second area where a circuit board is disposed, and a bending area disposed between the first area and the second area, a first support layer disposed beneath the active area and the first area, a second support layer disposed beneath the second area, an encapsulation layer disposed over the active area and the first area, and a polarization film disposed over the encapsulation layer. The polarization film extends up to at least a portion of the second area via the bending area.

In accordance with an embodiment of the present disclosure, a plurality of concave portions and convex portions can be disposed at a portion of the polarization film disposed in the bending area.

In accordance with an embodiment of the present disclosure, the polarization film can include a polarizer and a protective layer disposed at a portion of the polarization film disposed over the encapsulation layer and extending up to the second area via the bending area.

In accordance with an embodiment of the present disclosure, the polarization film can further include an adhesive layer.

In accordance with an embodiment of the present disclosure, the concave portions and convex portions can be arranged to extend in a first direction, and the first direction can be parallel to a longer-side direction of the flexible substrate.

In accordance with an embodiment of the present disclosure, the concave portions and convex portions can be arranged to extend in a second direction, and the second direction can be perpendicular to the longer-side direction of the flexible substrate.

In accordance with an embodiment of the present disclosure, the concave portions and convex portions can be disposed in the bending area while having the form of a plurality of dots.

In accordance with an embodiment of the present disclosure, the concave portions and convex portions can be formed through removal of a portion of at least one of the protective layer and the adhesive layer.

In accordance with an embodiment of the present disclosure, a notch can be formed to extend over the first area, the bending area and the second area, and the polarization film can have an outline corresponding to the notch.

In accordance with an embodiment of the present disclosure, the flexible display apparatus can further include a crack stopper structure disposed inside the flexible substrate while corresponding to the outline of the notch.

The flexible display apparatus according to another embodiment of the present disclosure can include a substrate including a display area and a non-display area, light emitting display elements disposed in the display area, and an encapsulation layer disposed over at least a portion of the non-display area while covering the light emitting display elements, a component formation part, a notch line and a bending part disposed in a portion of the non-display area, a support layer disposed beneath the display area, and a polarization structure disposed over the encapsulation layer. The polarization structure can extend up to the bending part while covering the component formation part and the notch line.

In accordance with an embodiment of the present disclosure, a plurality of grooves can be disposed at a portion of the polarization structure in the bending part.

In accordance with an embodiment of the present disclosure, the polarization structure can further include at least one protective layer disposed at a portion of the polarization structure corresponding to the bending part.

In accordance with an embodiment of the present disclosure, the polarization structure can further include an adhesive layer disposed at a lower surface of the protective layer.

In accordance with an embodiment of the present disclosure, the plurality of grooves disposed at the bending part can be arranged to extend in a first direction, and the first direction can be parallel to a longer-side direction of the substrate.

In accordance with an embodiment of the present disclosure, the plurality of grooves disposed at the bending part can be arranged to extend in a second direction, and the second direction can be perpendicular to the longer-side direction of the substrate.

In accordance with an embodiment of the present disclosure, the plurality of grooves disposed at the polarization structure can take the form of dots.

In accordance with an embodiment of the present disclosure, an opening can be provided at an upper surface of the non-display area, to allow the component formation part to be connected to an external power source.

In accordance with an embodiment of the present disclosure, the flexible display apparatus can further include a crack stopper structure disposed at the bending part inside the substrate while extending along the notch line.

In the display apparatus according to each embodiment of the present disclosure, the inactive area of the display panel, which is a non-display area, is bent at the entirety thereof or a portion thereof to have a predetermined radius of curvature, through application of a flexible substrate, such that the inactive area is disposed beneath the active area. Accordingly, it can be possible to provide a display apparatus in which a display panel thereof has an outer appearance having a slim bezel or a narrow bezel.

In the display apparatus according to each embodiment of the present disclosure, when the inactive area of the display panel, which is a non-display area, is bent at the entirety thereof or a portion thereof to have a predetermined radius of curvature, a space having a predetermined width is defined between portions of the flexible substrate facing after bending of the flexible substrate. In this case, the polarization film disposed in the active area extends up to the bending area of the flexible substrate in order to protect components such as various lines disposed in the bending area. Accordingly, it can be possible to reduce external impact possibly applied to the display panel before/after execution of a manufacturing process for the display panel and tension stress and shrinkage stress, to which the components disposed at the flexible substrate are possibly subjected during a bending process, and, as such, short circuit or breakage of the components can be prevented. Accordingly, a more stable display apparatus can be provided. Even when impact is applied to the display apparatus due to carelessness of the user, abnormality of a bent portion of the display apparatus can be prevented.

In the display apparatus according to each embodiment of the present disclosure, the first support layer is additionally disposed beneath the active area and the inactive area of the flexible substrate, and the second support layer is additionally disposed in the area facing the active area after bending of the flexible substrate. Accordingly, it can be possible to protect the light emitting elements, the circuits for driving of the light emitting elements, and other components disposed within the display panel from various distortion and strain, to which the flexible substrate made of a flexible material is possibly subjected during manufacture of the display panel.

Effects of the present disclosure are not limited to the above-described effects. Other effects not described in the present disclosure can be readily understood by those skilled in the art through the following description.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A flexible display apparatus comprising:
    a flexible substrate comprising an active area and an inactive area, the inactive area comprising a first area disposed adjacent to the active area, a second area where a circuit board is disposed, and a bending area disposed between the first area and the second area;
    a first support layer disposed below the active area and the first area, and a second support layer disposed below the second area;
    an encapsulation layer disposed over the active area and the first area; and
    a polarization film disposed over the encapsulation layer while extending up to at least a portion of the second area via the bending area,
    wherein the polarization film comprises a polarizer, a first protective layer, a second protective layer and a third protective layer disposed at a portion of the polarization film disposed over the encapsulation layer,
    wherein the polarizer and at least one of the first protective layer, the second protective layer and the third protective layer extend up to the second area via the bending area, and
    wherein the polarizer and the at least one of the first protective layer, the second protective layer and the third protective layer are attached to have the same outline in areas where the first area, the bending area and the second area are present.

2. The flexible display apparatus according to claim 1, wherein the polarization film comprises at least two layers.

3. The flexible display apparatus according to claim 1, wherein a plurality of concave portions and convex portions are disposed at a portion of the polarization film disposed in the bending area.

4. The flexible display apparatus according to claim 1, wherein the polarization film further comprises an adhesive layer.

5. The flexible display apparatus according to claim 4, wherein the plurality of concave portions and the plurality of convex portions are formed through removal of a portion of at least one of the first protective layer, the second protective layer and the third protective layer and the adhesive layer.

6. The flexible display apparatus according to claim 3, wherein the plurality of concave portions and the plurality of convex portions are arranged to extend in a first direction, and the first direction is parallel to a longer-side direction of the flexible substrate.

7. The flexible display apparatus according to claim 3, wherein the plurality of concave portions and the plurality of convex portions are arranged to extend in a second direction, and the second direction is perpendicular to a longer-side direction of the flexible substrate.

8. The flexible display apparatus according to claim 3, wherein the plurality of concave portions and the plurality of convex portions are disposed in the bending area and have a form of a plurality of dots.

9. The flexible display apparatus according to claim 1, wherein a notch is provided to extend over the first area, the bending area and the second area, and the polarization film has an outline corresponding to the notch.

10. The flexible display apparatus according to claim 1, further comprising:
    a crack stopper structure disposed inside the flexible substrate and corresponding to the outline of the notch.

11. A flexible display apparatus comprising:
    a substrate comprising a display area and a non-display area;
    light emitting display elements disposed in the display area, and an encapsulation layer disposed over at least a portion of the non-display area and covering the light emitting display elements;
    a component formation part, a notch line and a bending part disposed in a portion of the non-display area;
    a support layer disposed below the display area; and
    a polarization structure disposed over the encapsulation layer, the polarization structure extending up to the bending part and covering the component formation part and the notch line,
    wherein the polarization structure comprises a polarizer, a first protective layer, a second protective layer and a third protective layer disposed at a portion of the polarization structure disposed over the encapsulation layer,
    wherein the polarizer and at least one of the first protective layer, the second protective layer and the third protective layer extends up to the bending part, and wherein the polarizer and the at least one of the first protective layer, the second protective layer and the third protective layer are attached to have the same outline in areas where the first area, the bending area and the second area are present.

12. The flexible display apparatus according to claim 11, wherein the polarization structure comprises at least two layers.

13. The flexible display apparatus according to claim 11, wherein the polarization structure further comprises an adhesive layer disposed at a lower surface of the at least one of the first protective layer, the second protective layer and the third protective layer.

14. The flexible display apparatus according to claim 11, farther comprising a plurality of grooves disposed at a portion of the polarization structure corresponding to the bending part.

15. The flexible display apparatus according to claim 14, wherein the plurality of grooves disposed at the bending part are arranged to extend in a first direction, and the first direction is parallel to a longer-side direction of the substrate.

16. The flexible display apparatus according to claim 14, wherein the plurality of grooves disposed at the bending part are arranged to extend in a second direction, and the second direction is perpendicular to a longer-side direction of the substrate.

17. The flexible display apparatus according to claim 14, wherein the plurality of grooves disposed at the polarization structure have a form of dots.

18. The flexible display apparatus according to claim 11, wherein an opening is provided at an upper surface of the non-display area, to allow the component formation part to be connected to an external power source.

19. The flexible display apparatus according to claim 11, further comprising:
 a crack stopper structure disposed at the bending part inside the substrate while extending along the notch line.

* * * * *